United States Patent
Heller

(10) Patent No.: US 10,426,066 B2
(45) Date of Patent: Sep. 24, 2019

(54) ELECTRICAL MEMBER WITH AN ELECTROMAGNETIC SHIELDING, METHOD OF PRODUCING AN ELECTRICAL MEMBER WITH AN ELECTROMAGNETIC SHIELDING

(71) Applicant: TE Connectivity Germany GmbH, Bensheim (DE)

(72) Inventor: Christian Heller, Feuchtwangen (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 15/885,899

(22) Filed: Feb. 1, 2018

(65) Prior Publication Data

US 2018/0220557 A1   Aug. 2, 2018

(30) Foreign Application Priority Data

Feb. 1, 2017   (DE) ........................ 10 2017 201 616

(51) Int. Cl.
| | |
|---|---|
| *H05K 9/00* | (2006.01) |
| *H01R 13/6599* | (2011.01) |
| *H01R 43/18* | (2006.01) |
| *B29C 45/00* | (2006.01) |
| *B29L 31/34* | (2006.01) |
| *B29L 31/36* | (2006.01) |
| *C25D 5/02* | (2006.01) |
| *C23C 18/16* | (2006.01) |

(52) U.S. Cl.
CPC ....... *H05K 9/0007* (2013.01); *B29C 45/0053* (2013.01); *H01R 13/6599* (2013.01); *H01R 43/18* (2013.01); *H05K 9/0084* (2013.01); *B29C 2045/0079* (2013.01); *B29K 2995/0011* (2013.01); *B29L 2031/34* (2013.01); *B29L 2031/3481* (2013.01); *B29L 2031/36* (2013.01); *C23C 18/1605* (2013.01); *C25D 5/022* (2013.01)

(58) Field of Classification Search
CPC .................................................. H05K 9/0084
See application file for complete search history.

(56) References Cited

U.S. PATENT DOCUMENTS

| | | | |
|---|---|---|---|
| 5,170,009 A * | 12/1992 | Kadokura | C09D 5/448 174/363 |
| 8,822,844 B1 * | 9/2014 | Dimke | H05K 1/0219 174/386 |
| 2004/0079645 A1 | 4/2004 | Chiu et al. | |
| 2005/0277340 A1 | 12/2005 | Gordon et al. | |
| 2009/0239079 A1 | 9/2009 | Wojtaszek et al. | |
| 2015/0077961 A1 * | 3/2015 | Thiesen | H05K 9/00 361/765 |

OTHER PUBLICATIONS

Extended European Search Report, Application No. 18153560.0, dated Jun. 14, 2018, 7 pages.

\* cited by examiner

*Primary Examiner* — Hung V Ngo
(74) *Attorney, Agent, or Firm* — Barley Snyder

(57) ABSTRACT

An electrical member comprises a housing and an electromagnetic shielding. The electromagnetic shielding is formed at least in sections by an electrically conductive coating on the housing.

4 Claims, 6 Drawing Sheets

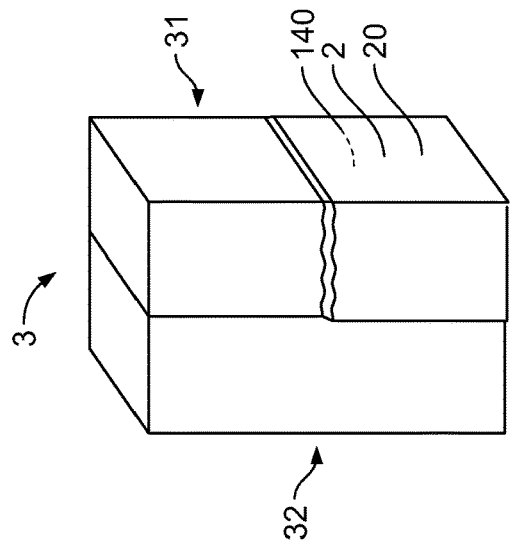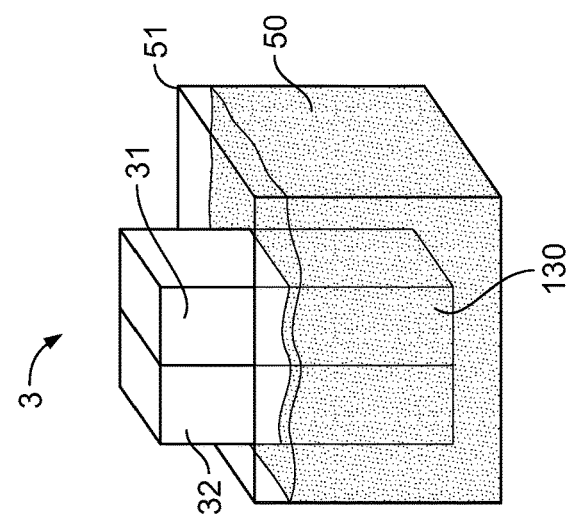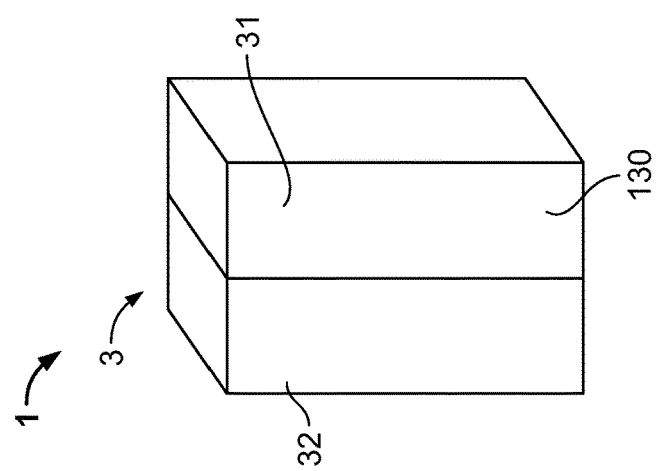

ELECTRICAL MEMBER WITH AN ELECTROMAGNETIC SHIELDING, METHOD OF PRODUCING AN ELECTRICAL MEMBER WITH AN ELECTROMAGNETIC SHIELDING

CROSS-REFERENCE TO RELATED APPLICATION

This application claims the benefit of the filing date under 35 U.S.C. § 119(a)-(d) of German Patent Application No. 102017201616.7, filed on Feb. 1, 2017.

FIELD OF THE INVENTION

The present invention relates to an electrical member and, more particularly, to an electrical member having an electromagnetic shielding.

BACKGROUND

Electrical members having an electromagnetic shielding known in the art have a housing around which a specifically shaped metal sheet is attached for electromagnetic shielding from interference radiation. Forming and attaching the electromagnetic shielding according to procedures known in the art, however, is complex and expensive.

SUMMARY

An electrical member comprises a housing and an electromagnetic shielding. The electromagnetic shielding is formed at least in sections by an electrically conductive coating on the housing.

BRIEF DESCRIPTION OF THE DRAWINGS

The invention will now be described by way of example with reference to the accompanying Figures, of which:

FIG. 3A is a perspective view of an electrical member according to another embodiment;

FIG. 3B is a perspective view of the electrical member of FIG. 3A immersed in a solution;

FIG. 3C is a perspective view of the electrical member of FIG. 3A with an electrically conductive coating;

DETAILED DESCRIPTION OF THE EMBODIMENT(S)

Figure 1:
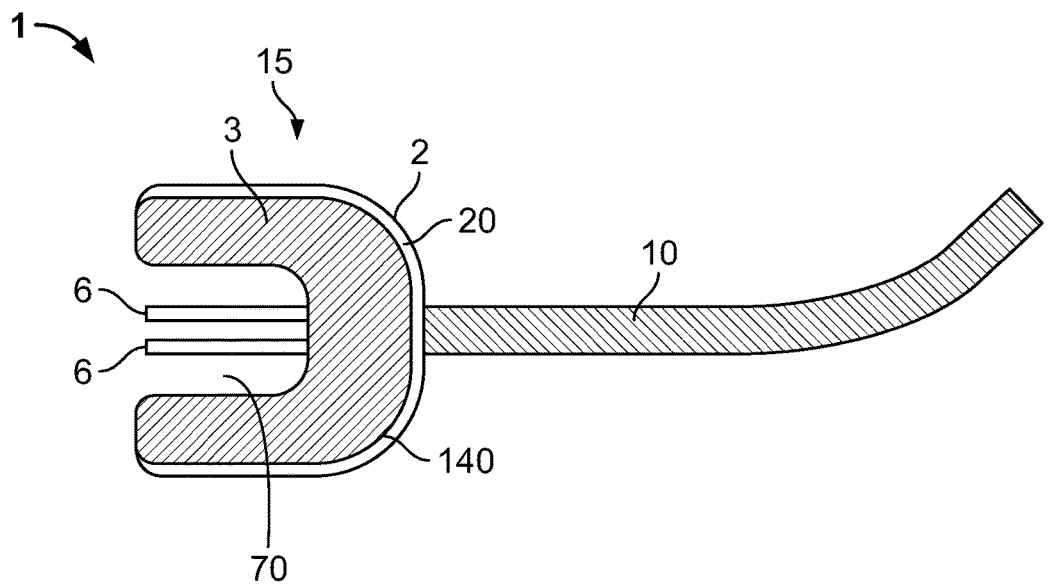
FIG. 1 is a sectional view of an electrical member according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

In an embodiment shown in FIG. 1, an electrical member 1 is a plug connector having a housing 3 with a plurality of contacts 6. The contacts 6 produce an electrical connection with contacts of a mating plug connector. Electrical currents are fed through a cable 10 electrically connected to the contacts 6. The housing 3 is formed of an insulative plastic material. In an embodiment, the housing 3 is injection molded.

In order to shield a connection region between the plug connector and the mating plug connector from electromagnetic radiation, as shown in FIG. 1, a portion 140 of the housing 3 is surrounded by an electromagnetic shielding 2. The electromagnetic shielding 2 is formed by an electrically conductive coating 20 on an exterior surface of the housing 3. In an embodiment, the electrically conductive coating 20 has a thickness of between 1 and 500 µm. The electromagnetic shielding 2 is located on an outer side 15 of the housing 3. Together with a corresponding shielding on the mating plug, an inner space 70 is shielded. In an embodiment, the electrically conductive coating 20 can be connected to a shielding element of the cable 10 via a connecting element in order to set the electrically conductive coating at ground potential.

Figure 2:
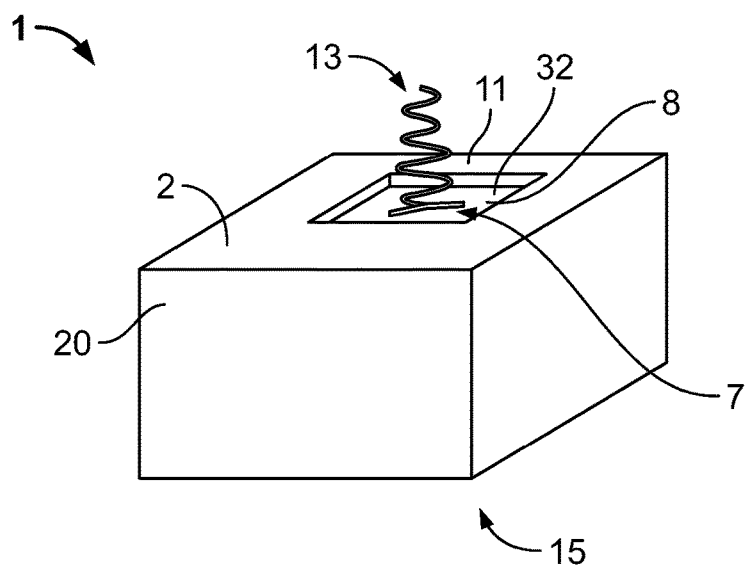
FIG. 2 is a perspective view of an electrical member according to another embodiment.

An electrical member 1 according to another embodiment is shown in FIG. 2. The electrical member 1 has the electromagnetic shielding 2 formed by the electrically conductive coating 20. The electromagnetic shielding 2 covers almost the entire outer side 15 of the electrical member 1 or of the housing 3. As shown in FIG. 2, the electromagnetic shielding 2 only has a gap in the region of an opening 8 on an upper side 11 of the housing 3; this gap emits electromagnetic radiation 13 by an antenna 7. In an embodiment, the housing 3 has a second component 32 that cannot be coated and is used to form the gap in the region of the antenna 7. The housing 3 has a first component 31 in portions of the housing 3 aside from the second component 32. The first component 31 can be coated and is covered by the electrically conductive coating 20.

A method of coating the housing 3 with the electrically conductive coating 20 is shown in FIGS. 3A-3C. The first component 31 and second component 32 of the housing 3 are shown in FIG. 3A. The first component 31 is a material which can be coated and the second component 32 is a material which cannot be coated; a coating portion 130 of the housing 3 which is to be coated is part of the first component 31. Electrical elements, which can be part of the electrical member 1, are not shown but can be located at different points on or in the housing 3, or can be covered or supported by the housing 3.

As shown in FIG. 3B, the housing 3 is at least partially immersed in a solution 50 which is located in a container 51. An electrically conductive coating 20 is deposited on the component 31 in the solution 50 and the second component 32 remains uncoated. The housing 3 is shown with the electrically conductive coating 20 on a coated portion 140 of the first component 31 in FIG. 3C.

Figure 4:
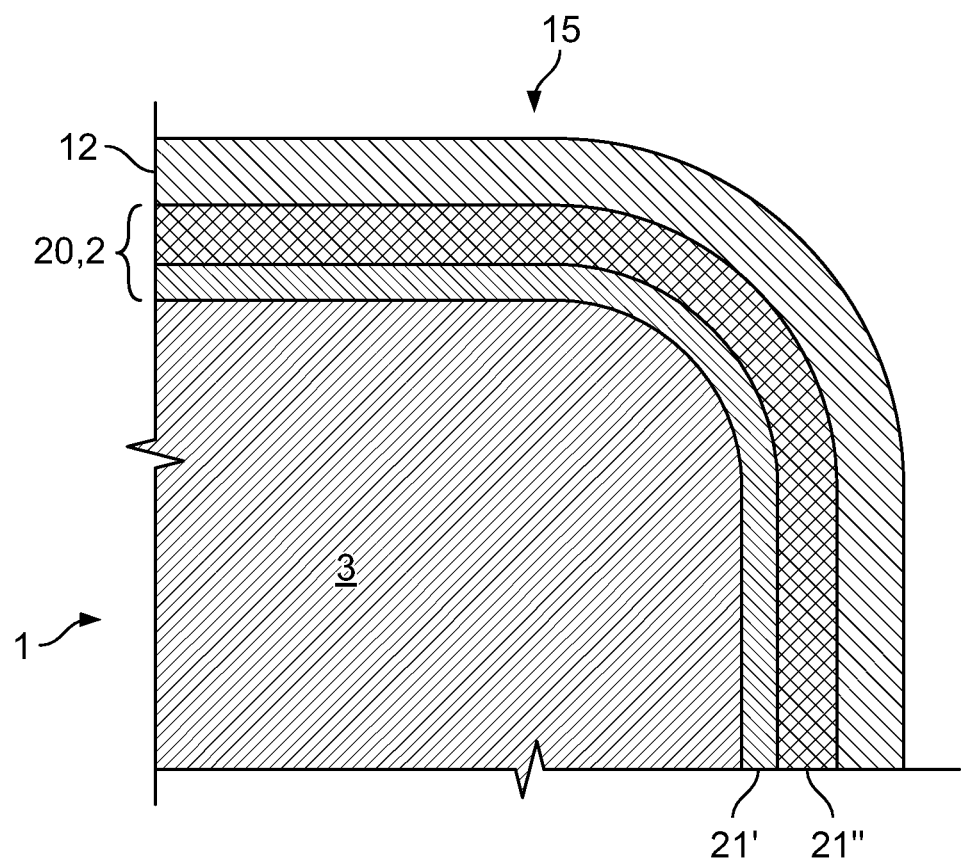
FIG. 4 is a sectional view of an electrical member according to another embodiment.

In an embodiment shown in FIG. 4, the electromagnetic shielding 2 on the housing 3 has two electrically conductive layers 21', 21". In various embodiments, the two layers 21', 21" can have different thicknesses and/or consist of different metal materials. In an embodiment, an inside layer 21' is an adhesive between the plastic of the housing 3 and an outside layer 21". The outside layer 21" has a better shielding effect than the inside layer 21'. Outside of the two electrically conductive layers 21', 21" forming the electrically conductive coating 20, a protective coat 12 is present which protects the two layers 21', 21" from mechanical or chemical external influences. The protective coat 12 is formed of an insulating material such as plastic or a metal oxide.

Another method of coating the housing 3 of the electrical member 1 is shown in FIGS. 5A-5D. The first component 31 is an activatable material 104; a material that is able to be coated with the electrically conductive coating 20 by an activation process. The second component 32 does not have to be able to be coated nor be activatable.

Figure 5A:
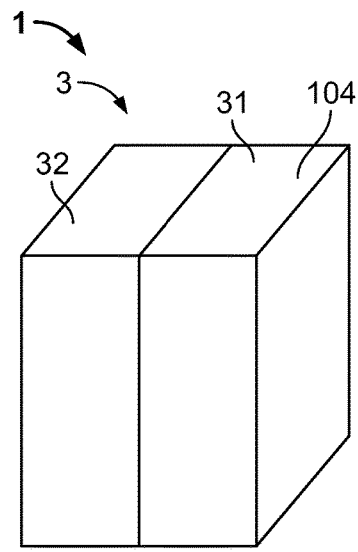
FIG. 5A is a perspective view of an electrical member according to another embodiment.
Figure 5B:
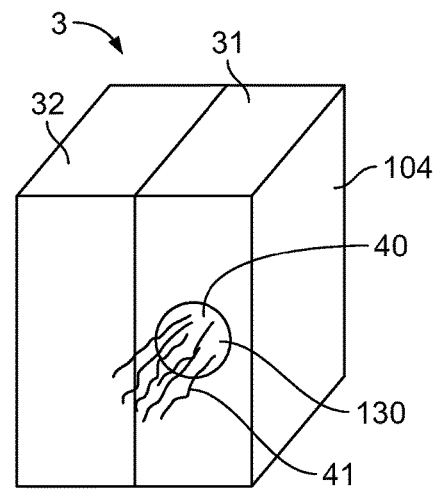
FIG. 5B is a perspective view of the electrical member of FIG. 5A with an activation portion.
Figure 5C:
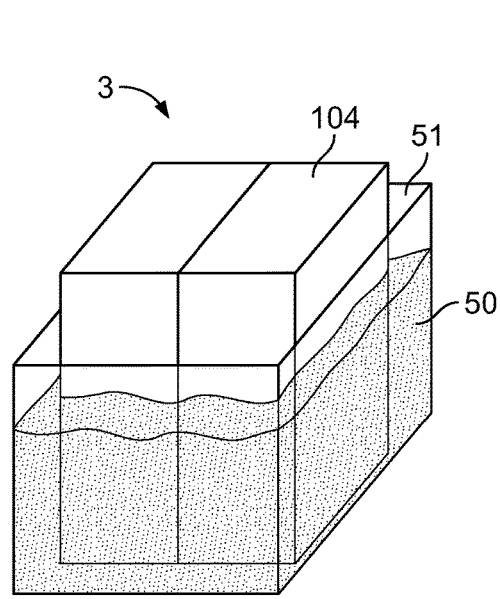
FIG. 5C is a perspective view of the electrical member of FIG. 5B immersed in a solution.
Figure 5D:
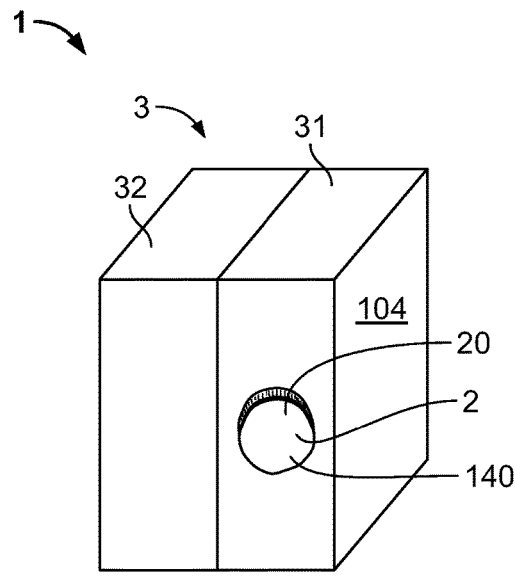
FIG. 5D is a perspective view of the electrical member of FIG. 5B with an electrically conductive coating.

The coating portion 130 of the first component 31 is activated by an activation radiation 41 to become an activation region 40 as shown in FIG. 5B. The first component 31 is able to be coated in the activation region 40 and remains unable to be coated outside of the activation region 40. In the coating step shown in FIG. 5C, which again comprises the at least partial immersion of the housing 3 in the solution 50 in the container 51, only the activation region 40 is coated with the electrically conductive coating 20 as shown in the electrical member 1 produced by this process in FIG. 5D. A large part of the electrical member 1 is uncoated and only a small coated portion 140 has the electromagnetic shielding 2 in the form of the electrically conductive coating 20.

Figure 6:
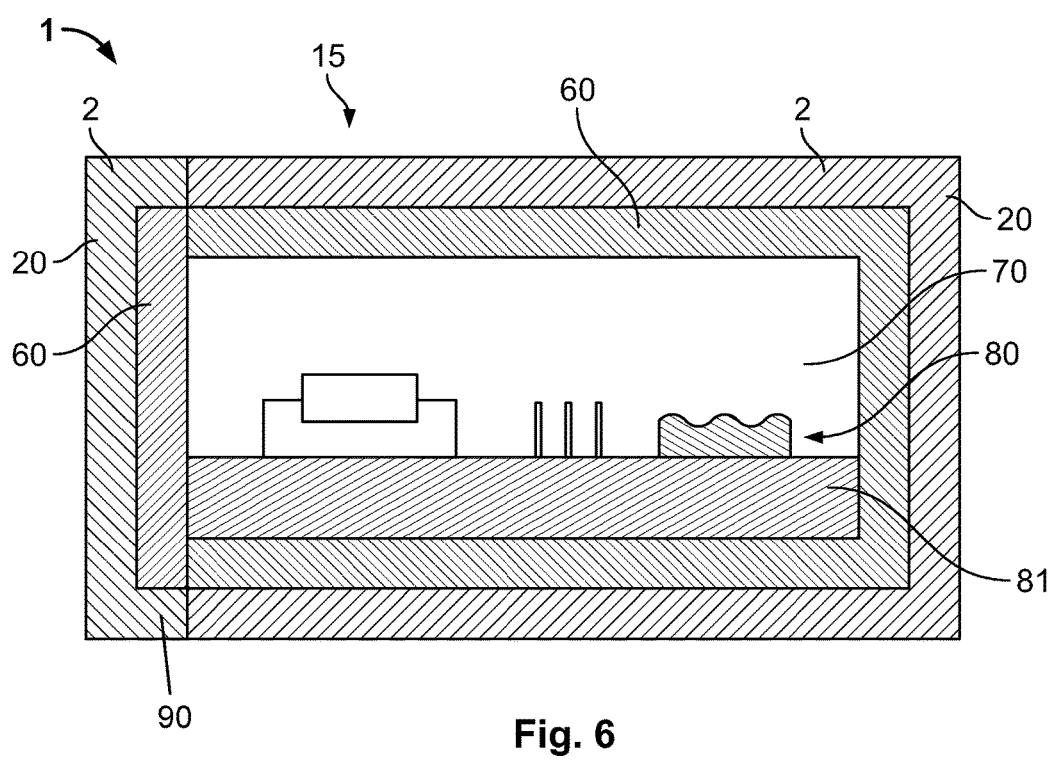
FIG. 6 is a sectional view of an electrical member according to another embodiment.

An electrical member 1 according to another embodiment is shown in FIG. 6. The electrical member 1 has a support 81 on which electrical elements 80 such as resistors, processors, or the like are arranged. Two shielding elements 60 form an inner space 70 in which the support 81 and the electrical elements 80 are arranged. Each of the shielding elements 60 has the electromagnetic shielding 2 in the form of the electrically conductive coating 20 on an exterior surface of the shielding elements 60. The coatings 20 together form a shielding 90 which entirely encloses the structural member 1 on all sides and neither allows electromagnetic radiation to pass through from the outside inwardly nor vice versa. In another embodiment, the shielding 90 has holes or gaps which are less than 10% of the wavelength of a radiation which is to be shielded.

Figure 7A:
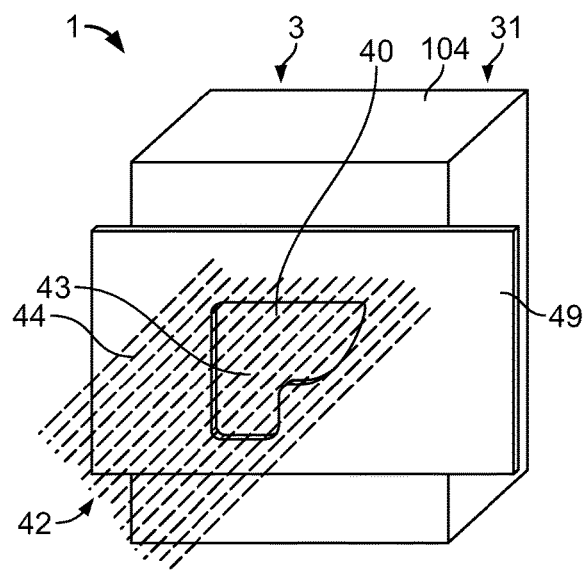
FIG. 7A is a perspective view of an electrical member according to another embodiment with a mask.
Figure 7B:
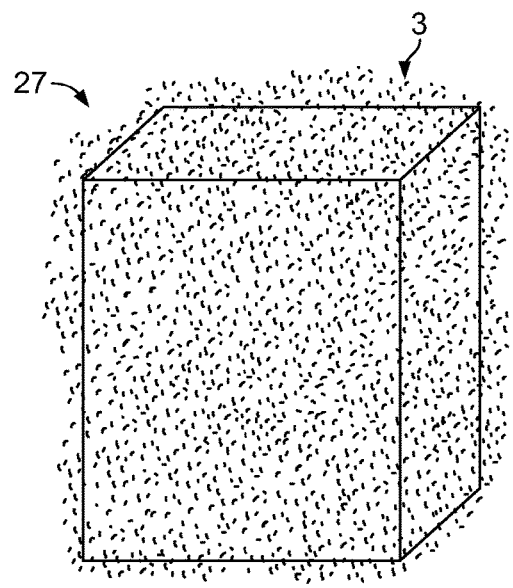
FIG. 7B is a perspective view of the electrical member of FIG. 7A exposed to a gas atmosphere.
Figure 7C:
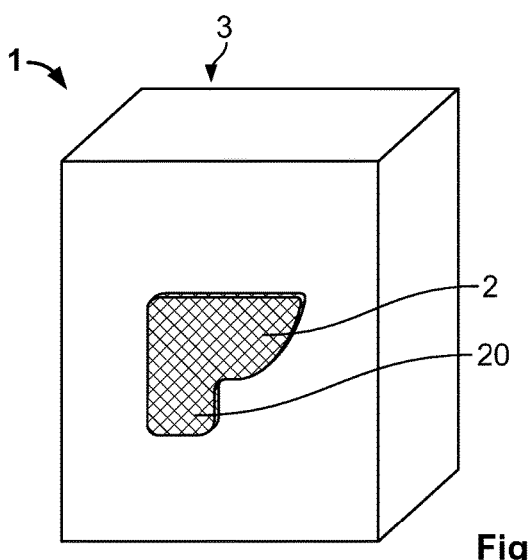
FIG. 7C is a perspective view of the electrical member of FIG. 7B with an electrically conductive coating.

A method of producing an electrical member 1 with the electromagnetic shielding 2 according to another embodiment is shown in FIGS. 7A-7C. In a step shown in FIG. 7A, the housing 3, which in this case consists of only one single component 31 which is activatable, is activated by rays 42 made from an activation material 44 in the region of a hole 43 in a mask 49. The activation region 40 on the housing 3 is defined by the hole 43, resulting in a selective activation in the activation region 40 due to the mask 49.

After the mask 49 is removed and the activation material 44 is optionally washed off in the activation region 40, as shown in FIG. 7B, the housing 3 is exposed to a gas atmosphere 27 which results in the housing 3 being coated with the electrically conductive coating 20 in the activation region 40, as shown in FIG. 7C. In another embodiment, coating can also be carried out in a selective manner by applying a material through the mask 49. A selective application such as by using an ink jet printer is also possible, both for an activation step and for a coating step. Other coating methods can also be used, such as brushing with a liquid, gel-like, or paste-like material.

What is claimed is:

1. An electrical member, comprising:
a housing formed of an insulative material and having a first component of a first material and a second component of a second material, the first component has an activatable material; and
an electromagnetic shielding formed at least in sections by an electrically conductive coating disposed directly on an exterior surface of the housing, the first component is at least partially coated with the electrically conductive coating and the second component is uncoated, the electrically conductive coating is coated on a portion of the activatable material that is activated and a portion of the activatable material that is not activated is uncoated.

2. The electrical member of claim 1, wherein the electrically conductive coating can be coated on the activatable material when the activatable material is activated.

3. The electrical member of claim 1, wherein the electrically conductive coating has a plurality of electrically conductive layers.

4. The electrical member of claim 3, further comprising a protective coat formed of an insulating material and coated on the electrically conductive layers.

* * * * *